United States Patent
Barry

(10) Patent No.: US 8,173,910 B2
(45) Date of Patent: May 8, 2012

(54) PRINTED CIRCUIT BOARD BALL GRID ARRAY SYSTEM HAVING IMPROVED MECHANICAL STRENGTH

(75) Inventor: Alan L. Barry, Torrance, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 883 days.

(21) Appl. No.: 12/178,973

(22) Filed: Jul. 24, 2008

(65) Prior Publication Data

US 2010/0018763 A1 Jan. 28, 2010

(51) Int. Cl.
*H05K 1/11* (2006.01)
*H05K 1/18* (2006.01)

(52) U.S. Cl. ........................................ 174/263; 361/761

(58) Field of Classification Search .................. 174/263, 174/266; 361/743, 760, 761; 228/180.22
See application file for complete search history.

(56) References Cited

U.S. PATENT DOCUMENTS

| | | | | |
|---|---|---|---|---|
| 5,591,941 | A * | 1/1997 | Acocella et al. | 174/266 |
| 6,512,185 | B2 * | 1/2003 | Itou | 174/260 |
| 6,543,128 | B2 * | 4/2003 | Huang et al. | 29/841 |
| 2005/0230147 | A1 * | 10/2005 | Momokawa | 174/256 |
| 2007/0062730 | A1 * | 3/2007 | Murry | 174/266 |
| 2009/0032294 | A1 * | 2/2009 | Hsu | 174/257 |

* cited by examiner

*Primary Examiner* — Timothy Thompson
*Assistant Examiner* — Roshn Varghese
(74) *Attorney, Agent, or Firm* — Ingrassia Fisher & Lorenz, P.C.

(57) ABSTRACT

A printed circuit board (PCB) ball grid array (BGA) system is provided. In one embodiment, the PCB BGA system includes a PCB, a PCB BGA pad formed on the PCB, a plated through-hole via disposed at least partially through the PCB proximate the PCB BGA pad, and a soldermask disposed over the PCB. The soldermask includes: (i) a BGA pad opening through which the PCB BGA pad is exposed, and (ii) a via opening through which a central portion of the plated through-hole via is exposed. The via opening has an inner diameter that is less than the outer diameter of the plated through-hole via.

16 Claims, 2 Drawing Sheets

PRINTED CIRCUIT BOARD BALL GRID ARRAY SYSTEM HAVING IMPROVED MECHANICAL STRENGTH

TECHNICAL FIELD

The present invention generally relates to printed circuit board (PCB) surface mount systems and, more particularly, to a high density PCB ball grid array system having an improved mechanical strength that is well-suited for use within high vibration environments.

BACKGROUND

Ball grid arrays (BGA) are a relatively new type of surface mount packaging wherein a matrix of solder balls is utilized to provide mechanical and electrical coupling between at least one electronic component and a host printed circuit board (PCB). A representative BGA-to-PCB interface may be formed by first depositing solder paste on selected BGA pads in a grid of BGA pads formed on a mounting surface of a host PCB. An electronic component, which has a corresponding grid of BGA pads formed thereon, is then positioned over the PCB. The electronic component is positioned such that each solder ball resides between and contacts a BGA pad of the electronic component and a BGA pad of the PCB. A reflow process is subsequently performed wherein the assembly is heated (e.g., via an infrared heater) while the electronic component is urged toward the PCB in a controlled manner (e.g., by a robot). As it approaches its melting point, each solder ball deforms and adheres to the bonding surfaces provided on the PCB pads. Each solder ball in the BGA thus forms a mechanical and electrical connection between the host PCB and the electronic component.

The continual demand to decrease the size and weight of electronic components has lead to the development of high density BGAs (also commonly referred to as "fine pitch BGAs"). In such high density BGAs, the outer diameter of each BGA pad provided on the PCB is reduced. This reduction in the size of the PCB BGA pads permits spacing between the pads and other conductive elements (e.g., plated through-hole vias) located on the PCB to be decreased; however, this reduction in the size of the PCB BGA pads also results in a corresponding decrease in the bonding surface area of each BGA pad and, therefore, a decrease in the overall mechanical strength of the BGA-to-PCB interface. In many applications, this decrease in mechanical strength is acceptable and does not negatively impact the reliability of the BGA-to-PCB interface. However, this decrease in mechanical strength may render the BGA-to-PCB interface unsatisfactory for use in certain applications wherein significant mechanical stressors (e.g., high vibratory forces) are routinely experienced, such as deployment within the inverter assembly of an electric or hybrid vehicle.

At least two main approaches have been introduced to increase the mechanical strength of the BGA-to-PCB interface in high density BGAs. In a first approach, the volume between solder balls and under the BGA is filled with an adhesive, such as epoxy glue. The epoxy glue significantly increases the strength of the BGA-to-PCB interface by bonding each solder ball to surrounding components of the PCB (e.g., the PCB BGA pad, the soldermask, etc.). However, the underfilling of the epoxy also adds undesirable cost and complexity to the manufacturing procedure. Furthermore, cracks or fractures may develop during device operation due to a difference in the coefficient of thermal expansion between the epoxy and the BGA package.

The strength of the BGA-to-PCB interface may also be increased by moving the plated through-hole vias into some or all of the PCB BGA pads and such that the vias are no longer located between the BGA pads on the circuit board. Such a via-in-pad approach permits the outer diameter, and thus the area of the bonding surface, of each BGA pad to be increased thereby improving the overall mechanical strength of the BGA-to-PCB interface. However, such a via-in-pad approach also increases the likelihood that solder may weep into the via through-hole during device processing. Although the via through-holes may be plugged with epoxy to prevent such solder weeping, the process of plugging the via through-holes adds considerable cost and complexity to the manufacturing process.

It should thus be appreciated that it would be desirable to provide a high density PCB BGA system that achieves a relatively high mechanical strength. Preferably, embodiments of such a PCB BGA system would be reliable and relatively inexpensive to produce. It would also be desirable for embodiments of such a PCB BGA system to provide an efficient heat dissipation path through the BGA-to-PCB interface. Other desirable features and characteristics of the present invention will become apparent from the subsequent detailed description and the appended claims, taken in conjunction with the accompanying drawings and the foregoing technical field and background.

SUMMARY

A printed circuit board (PCB) ball grid array (BGA) system is provided. In one embodiment, the PCB BGA system includes a PCB, a PCB BGA pad formed on the PCB, a plated through-hole via disposed at least partially through the PCB proximate the PCB BGA pad, and a soldermask disposed over the PCB. The soldermask includes: (i) a BGA pad opening through which the PCB BGA pad is exposed, and (ii) a via opening through which a central portion of the plated through-hole via is exposed. The via opening has an inner diameter that is less than the outer diameter of the plated through-hole via.

DESCRIPTION OF THE DRAWINGS

The present invention will hereinafter be described in conjunction with the following drawing figures, wherein like numerals denote like elements, and.

DETAILED DESCRIPTION OF AT LEAST ONE EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
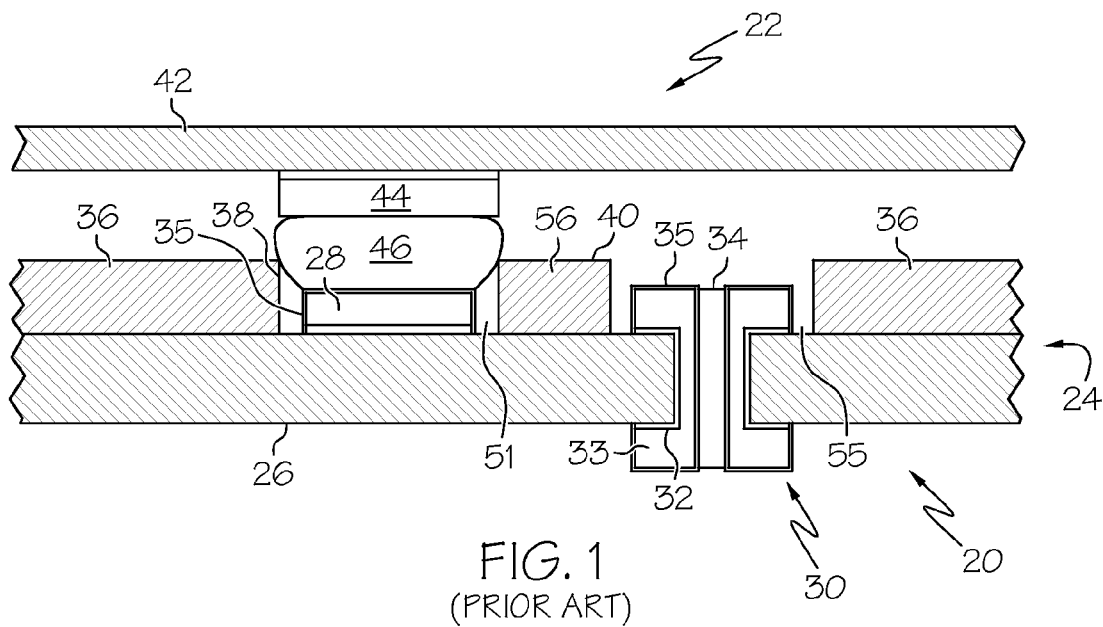
FIG. 1 is a side cross-sectional view of a printed circuit board (PCB) ball grid array (BGA) system having an electronic component mounted thereto in accordance with the teachings of prior art.

FIG. 1 is a side cross-sectional view of a printed circuit board (PCB) ball grid array (BGA) system 20 having a surface-mountable electronic component 22 mounted thereto in accordance with the teachings of prior art. It will be readily apparent to one skilled in the art that only a small portion of PCB BGA system 20 and a small portion of electronic component 22 are shown in FIG. 1. The illustrated portions of PCB BGA system 20 and electronic component 22 are typically repeated several hundred times to form a complete BGA-to-PCB interface. Consequently, the illustrated portions of PCB BGA system 20 and electronic component 22 are generally representative of the entire BGA-to-PCB interface and are sufficient for the purposes of the subsequent description.

As shown in FIG. 1, PCB BGA system 20 comprises a PCB 24 including a PCB substrate 26 (e.g., a substantially flat plastic or fiberglass board) on which one or more electronic components may be mounted. Although illustrated in FIG. 1 as a single block for clarity, PCB substrate 26 will generally include multiple patterned layers. A BGA pad 28 is formed on the upper surface of PCB substrate 26, and a plated through-hole via 30 is formed through PCB substrate 26 proximate BGA pad 28. Plated through-hole via 30 includes a conducive outer foil 32 (e.g., copper) and a plated body 33 (e.g., copper) defining a longitudinal channel 34 through a central portion of via 30. BGA pad 28 is electrically coupled to plated through-hole via 30, which is, in turn, electrically coupled to conductive members (e.g., copper traces) formed on various layers of PCB substrate 26. If desired, an outer plating 35 (e.g., tin or tin-lead) may be disposed over the outer surfaces of plate through-hole via 30 and BGA pad 28 to prevent corrosion of via 30 and pad 28.

An insulative soldermask 36 (e.g., a liquid photoimageable soldermask) is formed over PCB substrate 26. The illustrated portion of soldermask 36 includes two openings therethrough, namely, a BGA pad opening 38 and a via opening 40. BGA pad opening 38 exposes BGA pad 28 through soldermask 36 to permit the soldering of pad 28 as described more fully below. Similarly, via opening 40 exposes plated through-hole via 30 through soldermask 36. This substantially prevents material from soldermask 36 from flowing into longitudinal channel 34 during device processing.

As noted above, a surface-mountable electronic component 22 is mounted on PCB BGA system 20. Electronic component 22 includes, among other non-illustrated elements, a BGA substrate 42 having a BGA pad 44 formed thereon. For clarity, BGA pad 44 may be referred to herein as "the component BGA pad," while BGA pad 28 may be referred to herein as "the PCB BGA pad." Notably, PCB BGA pad 28 has a smaller outer diameter than does component BGA pad 44. A solder ball 46 resides between component BGA pad 44 and PCB BGA pad 28. Solder ball 46 is illustrated in FIG. 1 in a reflowed state. That is, solder ball 46 is illustrated after heating and compression between PCB BGA pad 28 and component BGA pad 44. After being reflowed in this manner, solder ball 46 adheres to the bonding surfaces of PCB BGA pad 28 and component BGA pad 44 to provide both a mechanical and electrical connection between electronic component 22 and PCB 24.

Figure 2:
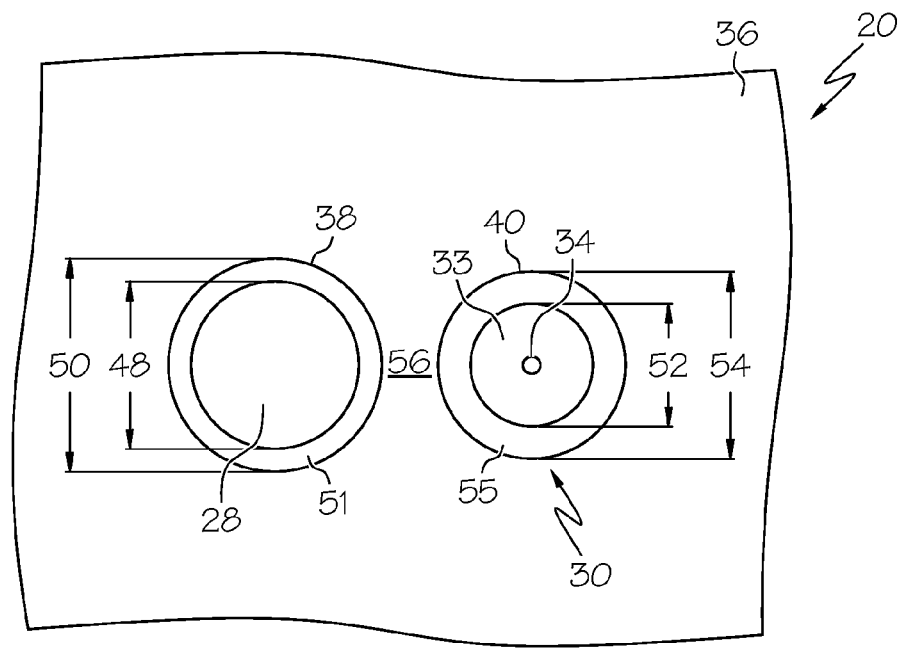
FIG. 2 is a top plan view of the PCB BGA system shown in FIG. 1 having the solder ball removed for clarity.

FIG. 2 is a top plan view of PCB BGA system 20 with solder ball 46 removed for clarity. In this view, it can be seen that PCB BGA pad 28, BGA pad opening 38, plated through-hole via 30, and via opening 40 each have a substantially circular planform shape. The outer diameter of PCB BGA pad 28 is less the inner diameter of BGA pad opening 38 (represented in FIG. 2 by arrows 48 and 50, respectively). A substantially annular circumferential clearance 51 is consequently provided between the outer circumferential wall of PCB BGA pad 28 and the inner circumferential wall of BGA pad opening 38. As an example, the outer diameter of PCB BGA pad 28 may be approximately 0.50 millimeter (mm), the inner diameter of BGA pad opening 38 may be approximately 0.55 mm to 0.59 mm, and the radial width of circumferential clearance 51 may be approximately 0.025 mm to 0.045 mm.

As indicated in FIG. 2, the outer diameter of plated through-hole via 30 is less than the inner diameter of via opening 40 (represented in FIG. 2 by arrows 52 and 54, respectively). Consequently, a second substantially annular circumferential clearance 55 is provided between the outer circumferential wall of plated through-hole via 30 and the inner circumferential wall of via opening 40. The outer diameter of plated through-hole via 30 may be, for example, approximately 0.51 mm; the inner diameter of via opening 40 may be, for example, approximately 0.55 mm to 0.59 mm; and the radial width of circumferential clearance 55 may be, for example, approximately 0.02 mm to 0.04 mm.

Referring collectively to FIGS. 1 and 2, soldermask 36 serves as a solder dam that substantially retains solder ball 46 during the reflow process. In particular, soldermask 36 substantially retains solder ball 46 within the space generally defined by the inner circumferential sidewall of BGA pad opening 38. As most easily appreciated in FIG. 1, the width of circumferential clearance 51 provided around PCB BGA pad 28, the volume of solder ball 46, and other such parameters generally prevent the ingress of solder ball 46 into the circumferential clearance provided around PCB BGA pad 28.

To permit the dimensions of PCB BGA system 20 to be minimized, the outer diameter of PCB BGA pad 28 may be reduced; e.g., as stated above, pad 28 may have an outer diameter of approximately 0.50 mm. While permitting the envelope of PCB BGA system 20 to be minimized, this reduction in the size of PCB BGA pad 28 also decreases the mechanical strength of the soldering joint formed between PCB BGA pad 28 and component BGA pad 44 and, therefore, the overall mechanical strength of the PCB-to-BGA interface. As a result, PCB BGA system 20 may not be suitable for use in applications characterized by significant mechanical stressors, such as high vibratory forces. To address this issue, an exemplary PCB BGA system will now be described in conjunction with FIGS. 3 and 4 that provides a high density PCB-to-BGA interface having a significantly improved mechanical strength.

Figure 3:
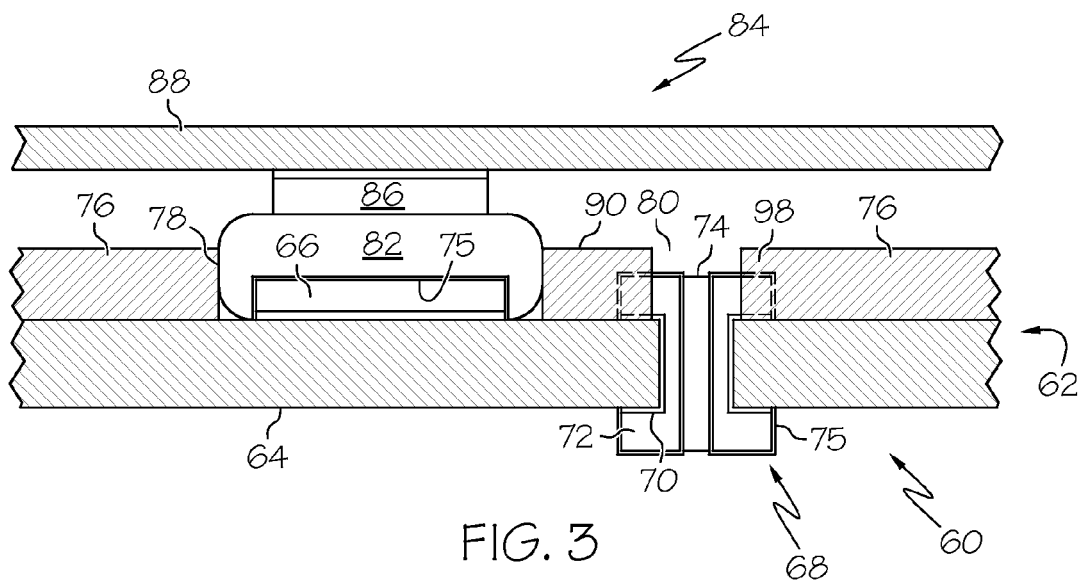
FIG. 3 is a side cross-sectional view of a printed circuit board (PCB) ball grid array (BGA) system having an electronic component mounted thereto in accordance with an exemplary embodiment.

FIG. 3 is a side cross-sectional view of a portion of ball printed circuit board (PCB) ball grid array (BGA) system 60 in accordance with an exemplary embodiment of the present invention. In several respects, PCB BGA system 60 is similar to PCB BGA system 20 shown in FIGS. 1 and 2. For example, PCB BGA system 60 comprises a PCB 62 including a multilayer PCB substrate 64 (e.g., a generally flat plastic or fiberglass board). A BGA pad 66 (referred to herein as the "PCB BGA pad") is formed on an upper surface of PCB substrate 64. PCB BGA pad 66 may be formed by, for example, photolithographic patterning copper to form the pad and subsequent plating of a metal (e.g. nickel/gold, silver, tin/lead or tin). A plated through-hole via 68 is electrically coupled to PCB BGA pad 66 and formed partially or entirely through PCB substrate 64. As was the case previously, plated through-hole via 68 may include a conducive outer foil 70 (e.g., copper) and a plated body 72 (e.g., copper with nickel/gold, silver, tin or tin lead finish) defining a longitudinal channel 74 through a central portion of via 68. An outer plating 75 may also be disposed over the outer surfaces of plated through-hole via 68 and BGA pad 66 to prevent the corrosion thereof. As a non-limiting example, outer plating 75 may comprise a tin or tin-lead finish.

An insulative soldermask 76 is formed over the illustrated layer of PCB substrate 64. As a non-limiting example, soldermask 76 may comprise an insulative film (e.g., a liquid photoimageable or dry film) onto the upper surface of PCB substrate 64. The illustrated portion of soldermask 76 is formed to include two openings therethrough; i.e., a BGA pad opening 78 through which PCB BGA pad 66 is entirely exposed, and a via opening 80 through which plated through-hole via 68 is partially exposed. It should be noted at this juncture, and as will be discussed in more detail below, via opening 80 is formed such soldermask 76 encroaches over, but does not fully cover, the upper surface of plated through-hole via 68.

PCB BGA system 60 further includes a solder ball 82, which is shown in FIG. 3 in a reflowed state. Solder ball 82 provides a mechanical and electrical connection between PCB 62 and a surface-mountable electrical component 84, such as an inverter processor. More specifically, electrical component 84 includes a BGA substrate 88 on which a component BGA pad 86 is formed. In its reflowed state, solder ball 82 is deformed between and adheres to the main bonding surfaces of PCB BGA pad 66 and component BGA pad 86. During the reflow process, soldermask 76 substantially retains solder ball 82 and may also direct solder into a substantially annular gap or clearance provided around PCB BGA pad 66 (i.e., clearance 95 described below). A separating portion 90 of soldermask 76 serves as a solder dam to prevent solderball 82 from flowing onto the neighboring via and subsequently down it's plated through-hole.

Figure 4:
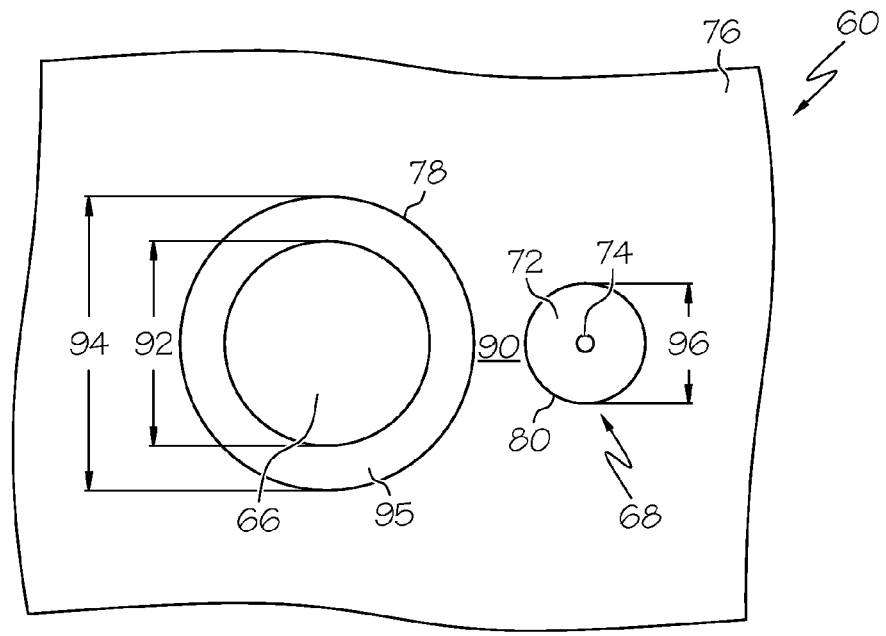
FIG. 4 is a top plan view of the exemplary PCB BGA system shown in FIG. 3 having the solder ball removed for clarity.

FIG. 4 is a top plan view of PCB BGA system 60 with solder ball 82 removed for clarity. In the illustrated exemplary embodiment, PCB BGA pad 66 and BGA pad opening 78 are substantially concentric and each have a generally circular planform shape. The outer diameter PCB BGA pad 66 is less the inner diameter of BGA pad opening 78 (represented in FIG. 4 by arrows 92 and 94, respectively). A substantially annular circumferential clearance 95 is thus provided between the outer circumferential wall of PCB BGA pad 66 and the inner circumferential wall of BGA pad opening 78. In a preferred embodiment, the outer diameter of BGA pad 66 is approximately 0.625 mm to approximately 0.65 mm, the inner diameter of BGA pad opening 78 is approximately 0.72 mm to approximately 0.76 mm, and the radial width of circumferential clearance 95 is approximately 0.035 mm to approximately 0.0675 mm (i.e., the inner diameter of BGA pad opening 78 is approximately 0.07 mm to approximately 0.135 mm greater than the outer diameter of BGA pad 66). In a more preferred embodiment, the outer diameter of BGA pad 66 is approximately 0.64 mm, the inner diameter of BGA pad opening 78 is approximately 0.73 mm to approximately 0.74 mm, and the radial width of circumferential clearance 95 is approximately 0.045 mm to approximately 0.05 mm.

As shown most clearly in FIG. 4, the outer diameter of plated through-hole via 68 is greater than the inner diameter of via opening 80 (represented in FIG. 4 by arrow 96). Thus, in contrast to PCB BGA system 20 (FIGS. 1 and 2), a circumferential clearance is not provided between the outer circumferential wall of plated through-hole via 76 and the inner circumferential wall of via opening 80. Instead, soldermask 76 encroaches over, but does not fully cover, the upper surface of plated through-hole via 68. More specifically, soldermask 76 covers an outer portion of the upper surface of plated through-hole via 68, but leaves exposed a central portion of via 68 through which longitudinal channel 74 is formed. Such "partial tenting" generally prevents soldermask 76 from weeping into longitudinal channel 74 of via 68.

Referring still to the exemplary embodiment shown in FIGS. 3 and 4, via opening 80 may be formed to have a substantially circular planform shape and may be substantially concentric with plated through-hole via 68. In a preferred embodiment, outer diameter of plated through-hole via 68 may be approximately 0.50 mm to approximately 0.52 mm, and the inner diameter of via opening 80 may be approximately 0.41 mm and approximately 0.45 mm. Consequently, soldermask 76 may include a substantially annular overlapping region 98 having a radial width of approximately 0.025 mm to approximately 0.055 mm. Stated differently, soldermask 76 may encroach approximately 0.025 mm to approximately 0.055 mm over the outer circumferential edge of through-hole via 68 (i.e., the outer diameter of via 68 is approximately 0.05 mm to approximately 0.11 mm greater than the inner diameter of via opening 80). In a more preferred embodiment, the outer diameter of plated through-hole via may be approximately 0.51 mm, and the inner diameter of via opening 80 may be approximately 0.40 mm to approximately 0.41 mm.

Separating portion 90 of soldermask 76 is preferably formed to have a sufficient width to act as a dam to prevent solder from flowing onto neighboring pads. As may be appreciated by comparing FIG. 3 to FIG. 1, separating portion 90 of soldermask 76 may have a width that is substantially equivalent to that of separating portion 56 of soldermask 36. In addition, the spacing between centerline of PCB BGA pad 66 and plated through-hole via 68 may be substantially equivalent to the spacing between the centerline of pad 28 (FIG. 1) and via 30 (FIG. 1). However, relative to PCB BGA system 20 (FIGS. 1 and 2), separating portion 90 of soldermask 76 resides closer to the centerline of plated through-hole via 68. Furthermore, relative to PCB BGA system 20 (FIGS. 1 and 2), the outer diameter of PCB BGA pad 66 and the width of circumferential clearance 95 (labeled in FIG. 4) provided around PCB BGA pad 66 is increased. For example, the outer diameter of PCB BGA pad 66 may be formed to have an outer diameter that is larger than that of component BGA pad 86; e.g., as stated above, the outer diameter of PCB BGA pad 66 may be approximately 0.625 mm to approximately 0.65 mm. This increase the outer diameter of PCB BGA pad 66 increases the area of the main bonding surface of pad 66. As a result, the mechanical strength of the solder joint formed between solder ball 82 and PCB BGA pad 66, and therefore the overall strength of BGA-to-PCB interface, is improved. Furthermore, this increase in the outer diameter of PCB BGA pad 66 provides a more efficient thermal path for conductive heat dissipation from electronic component 84 to PCB 62.

In addition to increasing the area of the BGA pad bonding surface, PCB BGA system 60 enhances the mechanical strength of the BGA-to-PCB interface in another manner; i.e., by causing solder ball 82 to flow into the circumferential clearance provided around PCB BGA pad 66 and circumferentially adhere to BGA pad 66. This is accomplished by increasing the width of circumferential clearance 95 (labeled in FIG. 4) provided around PCB BGA pad 66, while maintaining the appropriate solder dam width between the exposed portion of pad 66 and via 68. As noted above, the radial width of the circumferential clearance may be, for example, approximately 0.035 mm to approximately 0.0675 mm. In addition, the volume of solder ball 82 may be increased. In a preferred embodiment, the volume of solder ball 82 and the dimensions of circumferential clearance 95 are such that, in its reflowed state, solder ball 82 fills a majority, and perhaps substantially the entirety, of circumferential clearance 95. In such a case, solder ball 82 may substantially circumscribe or surround BGA pad 66. As shown in FIG. 3, solder ball 82 may also contact an upper surface of PCB substrate 64. By causing solder ball 82 to circumferentially engage PCB BGA pad 66 in this manner, the mechanical strength and the thermal conductivity of the BGA-to-PCB interface is significantly improved.

It should thus be appreciated that there has been provided an exemplary embodiment of a high density PCB BGA system having an improved mechanical strength. Embodiments of the above-described PCB BGA system are relatively durable, inexpensive to manufacture, and provide an efficient heat dissipation path through the BGA-to-PCB interface. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A printed circuit board (PCB) ball grid array (BGA) system, comprising:
    a PCB;
    a PCB BGA pad formed on the PCB;
    a plated through-hole via disposed at least partially through the PCB proximate the PCB BGA pad;
    a soldermask disposed over the PCB, the soldermask comprising:
        a BGA pad opening through which the PCB BGA pad is exposed; and
        a via opening through which a central portion of the plated through-hole via is exposed, the via opening having an inner diameter that is less than the outer diameter of the plated through-hole via such that an outer portion of the upper surface of the plated-through hole via is covered by the soldermask while a central portion of the upper surface of the plated-through hole via is exposed through the soldermask;
    an electronic component having a component BGA pad thereon; and
    a reflowed solder ball contacting and electrically coupling the component BGA pad and the PCB BGA pad, the reflowed solder ball disposed over and circumferentially adhered to the PCB BGA pad.

2. A PCB BGA system according to claim 1 wherein the inner diameter of the via opening is approximately 0.41 millimeter to approximately 0.45 millimeter.

3. A PCB BGA system according to claim 2 wherein the inner diameter of the BGA pad opening is approximately 0.07 millimeter to approximately 0.135 millimeter greater than the outer diameter of the PCB BGA pad.

4. A PCB BGA system according to claim 1 wherein the outer diameter of the plated through-hole via is approximately 0.05 millimeter to approximately 0.11 millimeter greater than the inner diameter of the via opening.

5. A PCB BGA system according to claim 1 wherein the BGA pad opening is concentric with the PCB BGA pad.

6. A PCB BGA system according to claim 5 wherein the via opening is concentric with the plated through-hole via.

7. A PCB BGA system according to claim 6 wherein the BGA pad opening and the via opening each have a generally circular planform shape.

8. A PCB BGA system according to claim 1 further comprising a plating disposed over the plated through-hole via, the plating comprising at least one of tin and lead.

9. A printed circuit board (PCB) ball grid array (BGA) system, comprising:
    a PCB;
    a PCB BGA pad disposed on the PCB;
    a plated through-hole via disposed at least partially through the PCB proximate the PCB BGA pad;
    a soldermask disposed over the PCB, the soldermask encroaching the plated through-hole via such that: (i) an outer portion of the upper surface of the plated through-hole via is covered by the soldermask, and (ii) a central portion of the upper surface of the plated through-hole via is exposed through the soldermask;
    an electronic component having a component BGA pad thereon; and
    a reflowed solder ball contacting and electrically coupling the component BGA pad and the PCB BGA pad, the reflowed solder ball circumscribing and circumferentially adhered to the PCB BGA pad.

10. A PCB BGA system according to claim 9 wherein the soldermask encroaches approximately 0.025 millimeter to approximately 0.055 millimeter over the outer circumferential edge of the plated through-hole via.

11. A PCB BGA system according to claim 9 wherein the soldermask has a BGA pad opening therethrough, the PCB BGA pad residing within the BGA pad opening and offset therefrom by a circumferential clearance.

12. A PCB BGA system according to claim 11 wherein the radial width of the circumferential clearance is approximately 0.045 millimeter to approximately 0.05 millimeter.

13. A PCB BGA system according to claim 11 wherein the BGA pad opening is concentric with the PCB BGA pad.

14. A printed circuit board (PCB) ball grid array (BGA) system for use in conjunction with an electronic component, the electronic component including a component BGA pad thereon, the PCB BGA system comprising:
    a PCB;
    a PCB BGA pad disposed on the PCB and having an outer diameter that is greater than the outer diameter of the component BGA pad;
    a plated through-hole via disposed at least partially through the PCB proximate the PCB BGA pad;
    a soldermask disposed over the PCB;
    a BGA pad opening formed through the soldermask and exposing the PCB BGA pad, the BGA pad opening having an inner diameter that is greater than the outer diameter of the PCB BGA pad;
    a via opening formed through the soldermask and partially exposing the plated through-hole via, the via opening having an inner diameter that is less than the outer diameter of the plated through-hole via such that an outer portion of the upper surface of the plated-through hole via is covered by the soldermask while a central portion of the upper surface of the plated-through hole via is exposed through the soldermask; and
    a reflowed solder ball cooperating with the PCB BGA pad and the component BGA pad to form a solder joint, the reflowed solder ball circumferentially engaging the PCB BGA pad.

15. A PCB BGA system according to claim 14 wherein the inner diameter of the BGA pad opening is approximately 0.07 millimeter to approximately 0.135 millimeter greater than the outer diameter of the PCB BGA pad.

16. A PCB BGA system according to claim 15 wherein the inner diameter of the via opening is approximately 0.05 millimeter to approximately 0.11 millimeter less than the outer diameter of the plated through-hole via.

* * * * *